(12) United States Patent
Rakhimova et al.

(10) Patent No.: US 8,317,929 B2
(45) Date of Patent: Nov. 27, 2012

(54) LITHOGRAPHIC APPARATUS COMPRISING AN ELECTRICAL DISCHARGE GENERATOR AND METHOD FOR CLEANING AN ELEMENT OF A LITHOGRAPHIC APPARATUS

(75) Inventors: Tatyana Victorovna Rakhimova, Moscow (RU); Vadim Yevgenyevich Banine, Helmond (NL); Vladimir Vitalevich Ivanov, Moscow (RU); Konstantin Nikolaevitch Koshelev, Troitsk (RU); Johannes Hubertus Johannes Moors, Helmond (NL); Aleksander Sergeevich Kovalev, Moscow (RU); Dmitriy Victorovich Lopaev, Moscow (RU)

(73) Assignee: ASML Netherlands B.V., Veldhoven (NL)

( * ) Notice: Subject to any disclaimer, the term of this patent is extended or adjusted under 35 U.S.C. 154(b) by 1082 days.

(21) Appl. No.: 11/367,693

(22) Filed: Mar. 6, 2006

(65) Prior Publication Data
US 2007/0062557 A1    Mar. 22, 2007

Related U.S. Application Data (60) Provisional application No. 60/717,240, filed on Sep. 16, 2005.

(51) Int. Cl.
*B08B 3/12* (2006.01)
*B08B 6/00* (2006.01)
*B08B 7/00* (2006.01)
*B08B 7/02* (2006.01)
*C25F 1/00* (2006.01)
*C25F 3/30* (2006.01)
*C25F 5/00* (2006.01)

(52) U.S. Cl. ............... 134/1; 134/1.1; 134/1.2; 134/1.3
(58) Field of Classification Search .................... None
See application file for complete search history.

(56) References Cited

U.S. PATENT DOCUMENTS

| 4,786,352 | A | * | 11/1988 | Benzing ............... 156/345.48 |
| 5,437,765 | A | * | 8/1995 | Loewenstein .............. 216/51 |
| 5,964,947 | A | * | 10/1999 | Zhao et al. ............... 118/715 |
| 6,362,110 | B1 | * | 3/2002 | Marks ..................... 438/711 |
| 7,135,692 | B2 | | 11/2006 | Ivanov et al. |
| 7,315,346 | B2 | | 1/2008 | Van Beek et al. |
| 2004/0007246 | A1 | | 1/2004 | Chan et al. |

(Continued)

FOREIGN PATENT DOCUMENTS

EP        0 227 839 A1    7/1987

(Continued)

OTHER PUBLICATIONS

European Search Report issued for European Application No. 06120641.3, dated Jan. 4, 2008.

(Continued)

*Primary Examiner* — Duy Deo
(74) *Attorney, Agent, or Firm* — Pillsbury Winthrop Shaw Pittman LLP (57) ABSTRACT

A method for cleaning elements of a lithographic apparatus, for example optical elements such as a collector mirror, includes providing a gas containing nitrogen; generating nitrogen radicals from at least part of the gas, thereby forming a radical containing gas; and providing at least part of the radical containing gas to the one or more elements of the apparatus. A lithographic apparatus includes a source and an optical element, and an electrical discharge generator arranged to generate a radio frequency discharge.

18 Claims, 4 Drawing Sheets

U.S. PATENT DOCUMENTS

| | | | |
|---|---|---|---|
| 2004/0165160 A1* | 8/2004 | Van Beek et al. | 355/30 |
| 2005/0133059 A1* | 6/2005 | Chen et al. | 134/1.1 |
| 2005/0139785 A1 | 6/2005 | Banine et al. | |

FOREIGN PATENT DOCUMENTS

| | | |
|---|---|---|
| EP | 0997761 A | 5/2000 |
| EP | 1223468 A | 7/2002 |
| EP | 1429189 A | 6/2004 |
| JP | 9-306803 A | 11/1997 |
| JP | 2004-216321 A | 8/2004 |
| TW | 237743 B | 8/2005 |
| TW | 259327 B | 8/2006 |
| WO | WO 2004/074932 A2 | 9/2004 |
| WO | WO 2004/104707 A2 | 12/2004 |

OTHER PUBLICATIONS

European Official Action issued on Feb. 9, 2009 in European Application No. 06 120 641.3.

Lavvas et al., "Coupling Photochemistry with Haze Formation in Titan's Atmosphere, Part I: Model Description". Planetary and Space Science 56 (2008) pp. 27-66.

English translation of Official Action issued on Feb. 3, 2009 in Taiwanese Application No. 095132583.

Singapore Office Action for Singapore Patent Application No. 200606307-7 dated Oct. 16, 2008.

Notice of Reasons for Rejection for Japanese Patent Application No. 2006-249166 dated May 26, 2009.

* cited by examiner

LITHOGRAPHIC APPARATUS COMPRISING AN ELECTRICAL DISCHARGE GENERATOR AND METHOD FOR CLEANING AN ELEMENT OF A LITHOGRAPHIC APPARATUS

CROSS REFERENCE TO RELATED APPLICATIONS

This application claims priority to U.S. Application 60/717,240, filed Sep. 16, 2005, the entire contents of which are hereby incorporated by reference.

BACKGROUND OF THE INVENTION

1. Field of the Invention

The present invention relates to a lithographic apparatus comprising a discharge generator and to a method for cleaning an element of a lithographic apparatus, especially a method for cleaning one or more optical elements of the lithographic apparatus.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus comprise steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, e.g. of around 13 nm. Such radiation is termed extreme ultraviolet (EUV) or soft x-ray, and possible sources comprise, for example, laser-produced plasma sources, discharge plasma sources, or synchrotron radiation from electron storage rings.

The source of EUV radiation is typically a plasma source, for example a laser-produced plasma or a discharge source. A common feature of any plasma source is the production of fast ions and atoms, which are expelled from the plasma in all directions. These particles can be damaging to the collector and condenser mirrors which are generally multilayer mirrors or grazing incidence mirrors, with fragile surfaces. This surface is gradually degraded due to the impact, or sputtering, of the particles expelled from the plasma and the lifetime of the mirrors is thus decreased. The sputtering effect is particularly problematic for the radiation collector. The purpose of this mirror is to collect radiation which is emitted in all directions by the plasma source and direct it towards other mirrors in the illumination system. The radiation collector is positioned very close to, and in line-of-sight with, the plasma source and therefore receives a large flux of fast particles from the plasma. Other mirrors in the system are generally damaged to a lesser degree by sputtering of particles expelled from the plasma since they may be shielded to some extent.

Due to the presence of (small) amounts of hydrocarbons, carbon (comprising carbon containing compounds) may deposit on optical elements or other elements of the lithographic apparatus such as walls etc. Especially deposition on optical elements may be undesired since deposition may be detrimental to the optical properties.

SUMMARY OF THE INVENTION

It is an aspect of the present invention to provide a method for cleaning an element of a lithographic apparatus, especially for cleaning one or more optical elements of the lithographic apparatus. It is further an aspect of the invention to provide a lithographic apparatus comprising an electrical discharge generator wherein the electrical discharge generator is arranged to provide an electrical discharge.

According to a first aspect of the invention a lithographic apparatus is provided comprising a source and one or more elements, especially one or more optical elements, the lithographic apparatus further comprising an electrical discharge generator arranged to generate an electrical discharge, more specifically a radio frequency discharge. This electrical RF discharge can be used to create one or more radical containing gasses selected from the group of a gas containing nitrogen radicals, a gas containing hydrogen radicals and a gas containing hydrogen and nitrogen radicals, and which radicals can be used for cleaning one or more elements of a lithographic apparatus, especially for cleaning one or more optical elements According to another aspect of the invention a method for cleaning one or more elements of a lithographic apparatus is provided, the method comprising providing a gas containing nitrogen; generating nitrogen radicals from at least part of the gas, thereby forming a radical containing gas; providing at least part of the radical containing gas to the one or more elements of the apparatus.

According to yet another aspect of the invention there is provided a method for cleaning one or more elements of a lithographic apparatus, the method comprising providing a gas containing one or more selected from the group of nitrogen and hydrogen; generating nitrogen radicals or hydrogen radicals or both nitrogen and hydrogen radicals from at least part of the gas, thereby forming a radical containing gas; providing at least part of the radical containing gas to the one or more elements of the apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
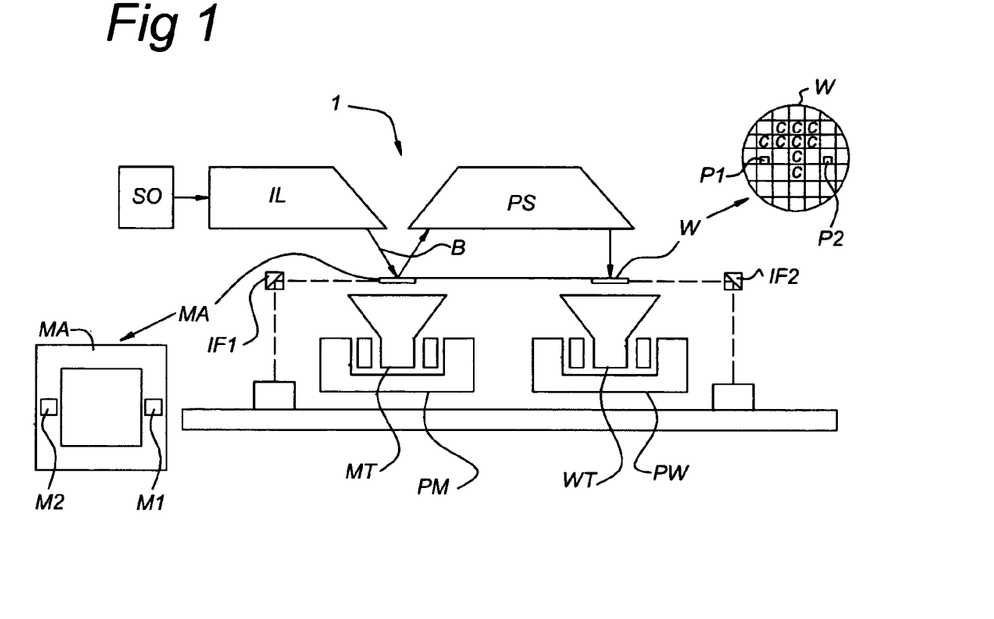
FIG. 1 schematically depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising part of, one, or more dies) of the substrate W.

The illumination system may comprise various types of optical components, such as refractive, reflective, magnetic, electromagnetic, electrostatic or other types of optical components, or any combination thereof, to direct, shape, or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices comprise masks, programmable mirror arrays, and programmable LCD panels. Masks are well known in lithography, and comprise mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, comprising refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Hence, in an embodiment according to the invention, there is provided a lithographic apparatus comprising a source, an illumination system (receiving radiation from a radiation source and) configured to condition a radiation beam; a support configured to support a patterning device, the patterning device being configured to impart the radiation beam with a pattern in its cross-section to form a patterned radiation beam; a substrate table configured to hold a substrate; a projection system configured to project the patterned radiation beam onto a target portion of the substrate, and a cleaning device according to the invention.

The terms "halogen containing gas" or "gas comprising a halogen", "hydrogen containing gas" or "gas comprising halogen", and "nitrogen containing gas" or "gas comprising nitrogen" refer to gasses or gas mixtures comprising at least a halogen containing compound, a hydrogen containing compound and a nitrogen containing compound, respectively.

The term "halogen" refers in an embodiment to at least one or more selected of F, Cl, Br and I, either as an atom (radical) or as compound, for example $F_2$, $Cl_2$, $Br_2$, $I_2$, HF, HCl, HBr, HI, interhalogen compounds, for example $ClF_3$, or other compounds comprising one or more selected of F, Cl, Br and I. In an embodiment as halogen one or more of $F_2$, $Cl_2$, $Br_2$, $I_2$ may be used, in particular $I_2$.

The terms "hydrogen" and "hydrogen radicals" imply to comprise their isotopes as well, in particular, deuterium. Hence, the term "hydrogen containing gas" refers to a gas comprising $H_2$ or deuterium or tritium analogues thereof. In an embodiment, the hydrogen containing gas comprises one or more selected from the group of $H_2$, HD, $D_2$, HT, DT, $T_2$. In a variant, the gas consists of one or more selected from the group of $H_2$, HD, $D_2$, HT, DT, $T_2$.

The term "nitrogen" and "nitrogen radicals" refer in an embodiment to $N_2$ and N atoms respectively. Hence, the terms "nitrogen" and a "gas containing nitrogen" comprise $N_2$ (dinitrogen) and an $N_2$ containing gas. In another embodiment, the gas comprises $N_2$ or in a more variant, the gas consist of $N_2$. In another embodiment the gas comprises nitrogen containing compounds such as $NH_3$, which may also be used to generate N radicals or H radicals or both. In yet another embodiment, the gas comprising nitrogen compounds comprises nitrogen compounds such as one or more selected from the group of $NH_3$, $HD_3$, $N_2C_2$, $N_2H_4$, $N_2H_4*H_2O$, $N_2O$, NO and $NO_2$. In a further embodiment, the gas containing nitrogen comprises $N_2$ or $NH_3$ or both.

The term "radical containing gas" comprises "a gas containing radicals" and refers to a gas, wherein in the gas hydrogen radicals or nitrogen radicals or both are present. Usually, such a gas will also contain hydrogen molecules (like one or more of $H_2$, HD, $D_2$, HT, DT, $T_2$) and $N_2$, respectively, since not all hydrogen and not all nitrogen, respectively, may be converted into radicals, and due to radical recombination. The term "hydrogen radical containing gas" refers to a gas comprising hydrogen radicals or deuterium or tritium analogues thereof. Such gas may further comprise other components like $H_2$, etc., which has not been dissociated or has recombined from hydrogen radicals. Likewise, the term "nitrogen radical containing gas" refers to a gas comprising nitrogen radicals. Such gas may further comprise other components like $N_2$, etc., which has not been dissociated or has recombined from hydrogen radicals.

A halogen containing gas or a hydrogen containing gas or a nitrogen containing gas or the radical containing gas may further comprise additional components like buffer gasses, such as Ar, He, etc. In an embodiment, the gasses are used at temperatures up to about 200° C.

Herein the term "carbon" (C) or "carbon deposition" refer to carbon containing compounds (that may have deposited on elements of the lithographic apparatus such as optical elements, for instance due to outgassing of plastic tubes, oil from pumps, etc) comprising hydrocarbons.

The term "lens", where the context allows, may refer to any one or combination of various types of optical components, comprising refractive, reflective, magnetic, electromagnetic and electrostatic optical components.

The terms "radiation" and "beam" used herein encompass all types of electromagnetic radiation, comprising ultraviolet (UV) radiation (e.g. having a wavelength $\lambda$ of 365, 248, 193, 157 or 126 nm) and extreme ultra-violet (EUV or soft X-ray) radiation (e.g. having a wavelength in the range of 5-20 nm, e.g. 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. VUV is Vacuum UV (i.e. UV absorbed by air) and refers to wavelengths of approximately 100-200 nm. DUV is Deep UV, and is usually used in lithography for the wavelengths produced by excimer lasers like 126 nm-248 nm. The person skilled in the art understands that radiation having a wavelength in the range of, for example, 5-20 nm relates to radiation with a certain wavelength band, of which at least part is in the range of 5-20 nm. In an embodiment, the source SO is arranged to generate EUV radiation of 5-20 nm, especially for use in EUV lithography.

The terms "electrical discharge generator" and "cleaning method" refer to a device and a method that may be used in a cleaning process. As mentioned below, providing hydrogen radicals may be used for reduction of oxides, like Sn oxides and next, halogens (like for instance $I_2$) may remove the metal, like Sn (by the formation of halides). Hence, "cleaning" in this context may imply a complete or partial removal of undesired deposition but may also imply a part of a cleaning process, like a reduction (without substantially removing deposition). Therefore, the term cleaning also comprises treating (with a gas) in the course of a cleaning of a cleaning process. Further, in an embodiment hydrogen radicals may nevertheless be used to remove deposition.

The electrical discharge generator as mentioned above is an "additional" discharge generator. For instance, the source SO may also provide a discharge, although also other sources may be used, as should be appreciated. Whether the source SO comprises a source generating a discharge or not, the electrical discharge generator herein is an additional discharge generator in the sense that it is additional to a state of the art lithographic apparatus. Further, the electrical discharge generator for use in the present invention is not arranged or designed to generate (EUV) radiation for use in the lithographic apparatus, but is arranged and designed to generate a discharge for cleaning elements, especially optical elements, of the lithographic apparatus, which are present outside a chamber containing the source SO. In an embodiment, the electrical discharge generator is designed and arranged to generate a RF discharge. The electrical discharge generator is especially arranged in such a way that an electrical discharge is generated within 100 cm or less of an element to be cleaned, such as a chamber wall or an optical element such as a collector mirror. In an embodiment, the electrical discharge generator is arranged in such a way that an electrical discharge is generated within 60 cm or less of the element (such as an optical element). In yet a more embodiment, the electrical discharge generator is arranged in such a way that an electrical discharge is generated within 40 cm or less of the element. In yet an even more embodiment, the electrical discharge generator is arranged in such a way that an electrical discharge is generated within 20 cm or less of the element.

In an embodiment, at least part of a coil or at least part of a conducting plate is integrated with the optical element. In this way, the invention provides an electrical discharge generator wherein the electrical discharge generator is arranged to provide an electrical discharge, which discharge is used to create one or more radical containing gasses selected from the group of a gas containing nitrogen radicals, a gas containing hydrogen radicals and a gas containing hydrogen and nitrogen radicals, and which radicals are used for cleaning one or more elements of a lithographic apparatus, especially for cleaning one or more optical elements.

Herein the term "integrated with" also comprises embodiments wherein the at least part of the (optical) element is conducting and is used as coil for generation of an inductively generated discharge or is used as conductive plate or bar, etc., for generation of an capacitively generated discharge. Also walls or part of walls can be used as plate or coil for generating an RF discharge. The term "integrated with" also comprises embodiments wherein for instance part of an element of wall is conductive and can be used as coil or plate for generating an electrical discharge. For example, reflectors, mirrors etc. may have a support that comprises conducting parts. As should be appreciated, there are a number of alternative ways to arrange coils or to arrange electrodes and counter electrodes, respectively.

As mentioned above, the electrical discharge generator may be used to generate hydrogen radicals from a hydrogen containing gas, but may alternatively or in addition also be used to generate nitrogen radicals from a nitrogen containing gas, which radicals can be used to clean surfaces of optical elements from for instance carbon deposition. Hence, in an embodiment the electrical discharge generator for use in the method of the invention is arranged and designed to generate hydrogen radicals from (at least part of) a hydrogen containing gas and in another embodiment, the electrical discharge generator is arranged and designed to generate nitrogen radicals from (at least part of) a nitrogen containing gas. Yet, in a further embodiment, the electrical discharge generator is designed and arranged to generate hydrogen radicals and nitrogen radicals from (at least part of) a gas containing hydrogen and nitrogen.

A feature of nitrogen atoms is connected with their relatively large size, which may imply for instance that they cannot, or cannot easily, penetrate through Ru (ruthenium) cap layers on for instance mirrors, in contrast to for instance H atoms, which relatively easily penetrate thin Ru layer and may damage multi layer (ML) mirrors such as a collector mirror. The N atom forms stable gaseous substances as with carbon (CN, $C_2N_2$) as with oxygen (NO, $N_2O$, $N_2O_3$, $N_2O_4$, $N_2O_5$, etc.), which allow its use both for cleaning of ML mirrors and for cleaning of chamber walls after its exposure to atmosphere. Besides, the nitrogen atom is a much "stronger" radical than hydrogen atom; it has ~5 eV of chemical energy per atom instead of 2.25 eV per atom for hydrogen. As a result, it may split larger number of complex hydrocarbon molecules which are supposed to be main source of impurities on ML mirror and on chamber wall. The high dissociation potential of nitrogen may be met by using a radio-frequency (RF) discharge generator. Hence, not only carbon may be removed by the nitrogen radicals or atoms, the method of the invention can also be used to remove oxygen.

Suitable conditions for nitrogen dissociation are known. In an embodiment, a gas mixture of nitrogen and noble gas (for example: 1-30 vol. % of $N_2$ in Ar, but pure $N_2$ may also be used) at pressures of about 0.001-10 bar (0.1-$10^6$ Pa) may be used to generate nitrogen radicals by the radical generator. In an embodiment, pressures of about 0.01-1 mbar (1-100 Pa) are used. The partial pressure of the gas containing nitrogen, especially $N_2$, can in an embodiment range between about 0.1 and 100% of the total pressure. In an embodiment, the $N_2$ partial pressure is at least 0.001 bar.

Hydrogen radicals can also be used to remove carbon deposition and/or to remove oxygen, but hydrogen radicals can also be used to remove depositions like Sn (for instance due to deposition of Sn from a Sn EUV source. Hydrogen radicals can further be used to reduce oxides like Sn-oxides to metallic species (Sn) which may than subsequently be removed by hydrogen radicals forming hydrides (like $SNH_4$) and/or with halogens forming halides (like $SnI_4$).

Suitable conditions for hydrogen dissociation are known. In an embodiment, a gas mixture of hydrogen and noble gas (for example: 1-30 vol. % of $H_2$ in Ar, but pure $H_2$ may also be used) at pressures of about 0.001 mbar-10 bar (0.1-$10^6$ Pa) may be used to generate hydrogen radicals by the radical generator. In an embodiment, pressures of about 0.01 mbar-1 bar (1-$10^5$ Pa) are used. The partial pressure of the gas containing hydrogen, especially $H_2$, (or analogues such as $D_2$, HD, etc.), can in an embodiment range between about 0.1 and 100% of the total pressure. In an embodiment, the $H_2$ partial pressure is at least 0.001 bar.

Hence, in general pressures of about 0.001 mbar-10 bar will be used. Herein the term "pressure" refers to total pressure, in distinction from "partial pressure".

Herein, the term "electrical discharge" or "electrical gas discharge" is known and refers to an electrical discharge through an ionized gas, i.e. a plasma.

The potential applied to generate the electrical discharge will in general be found between about 80 and 100,000 V. In an embodiment, the radicals are generated from the gas using a radio frequency (RF) discharge, especially at RF frequencies of about 1-1000 MHz. In a variant, the voltage applied is about 100-5000 V (in general, the RF discharge is obtained at a lower voltage that the pulsed DC discharge of an EUV source SO). In yet a further variant, the frequency of the RF discharge is about 10-300 MHz, for instance 140-180 MHz. As should be appreciated, the frequency and voltage may be varied, depending upon the hydrogen or nitrogen or both hydrogen and nitrogen pressure, as well as the total (local) pressure where the electrical discharge is to be generated. As should also be appreciated, the voltage to be applied may be a function of RF power, frequency and $N_2$ and optional fill gas pressure (or $H_2$ and optional fill gas pressure; or both $H_2$ and $N_2$ and optional fill gas pressure). Its amplitude may vary from about 100 V to several kV (such as 2000 V). Generally the voltage is small at high frequency and small RF power. For instance, using 1 vol. % $N_2$ in Ar at a total pressure of 0.1 mbar: ~100 V at ~ 100 MHz and power flux ~0.01 W/cm$^2$. It may be larger at smaller frequency and larger pressure: ~1000 V at 10 MHz and power flux ~0.1 W/cm$^2$ at 1 mbar. For larger $N_2$ concentration, higher voltages may be applied. However, the skilled technician knows how to generate an electrical discharge. In an embodiment, power fluxes of about 1 mW/cm$^2$-100 W/cm$^2$ may be applied.

Hence, in the method of the invention, hydrogen radicals may be used to clean surfaces from for instance Sn deposition from a Sn source or carbon (comprising hydrocarbon) deposition from for instance outgassing of plastic tubes, etc. However, hydrogen radicals may also be used to reduce oxides, for instance Sn-oxides to Sn, which reduced oxides may then subsequently be removed by hydrogen radicals forming volatile Sn-hydrides or by halides, forming volatile Sn-halides.

Nitrogen radicals may be used to remove carbon deposition or may be used to remove (at least part) from oxygen left in the lithographic apparatus. Hence, the invention provides in an embodiment the use of (and a method of using) nitrogen radicals for removing carbon deposition from optical elements. Likewise, in another embodiment, the invention provides the use of (and a method of using) nitrogen radicals for removing oxygen from a lithographic apparatus.

Therefore, in an aspect the invention is directed to a method for cleaning one or more elements (to be cleaned) of a lithographic apparatus, the method comprising providing a gas containing nitrogen; generating nitrogen radicals from at least part of the gas, thereby forming a radical containing gas; providing at least part of the radical containing gas to the one or more elements of the apparatus, and in another aspect, the invention is directed to a method for cleaning one or more elements (to be cleaned) of a lithographic apparatus, the method comprising providing a gas containing one or more selected from the group of nitrogen and hydrogen; generating nitrogen radicals or hydrogen radicals or both nitrogen and hydrogen radicals from at least part of the gas, thereby forming a radical containing gas; providing at least part of the radical containing gas to the one or more elements of the apparatus. These embodiments of the method of the invention may be performed in the lithographic apparatus according to the invention.

Yet, in an embodiment, the gas may further comprise a halogen, as mentioned above. In another embodiment, the one or more elements are cleaned by providing a hydrogen radical containing gas to the one or more elements and subsequently providing a nitrogen radical containing gas to the one or more elements. In yet another embodiment, the one or more elements are cleaned by providing a radical containing gas containing radicals selected from the group of hydrogen radicals and nitrogen radicals to the one or more elements and subsequently providing a halogen containing gas to the one or more elements.

According to yet another aspect of the invention, the invention is directed to a method for cleaning one or more elements (to be cleaned) of a lithographic apparatus, the method comprising providing a gas containing hydrogen; generating hydrogen radicals from at least part of the gas, thereby forming a radical containing gas; providing at least part of the radical containing gas to the one or more elements of the apparatus. This method may be performed in the lithographic apparatus of the invention.

The method of the invention is in an embodiment especially suitable for cleaning one or more elements selected from the group of a mirror, a grating, a reticle, a sensor, a support, a lithographic apparatus chamber and a lithographic apparatus (chamber) wall. In an embodiment, the method is applied for cleaning one or more optical elements, which optical elements are selected from the group of multilayer mirrors, normal incidence mirrors, grazing incidence mirrors, collector mirrors, reticles, filters, apertures, masking blades, gratings and optical sensors.

Figure 2:
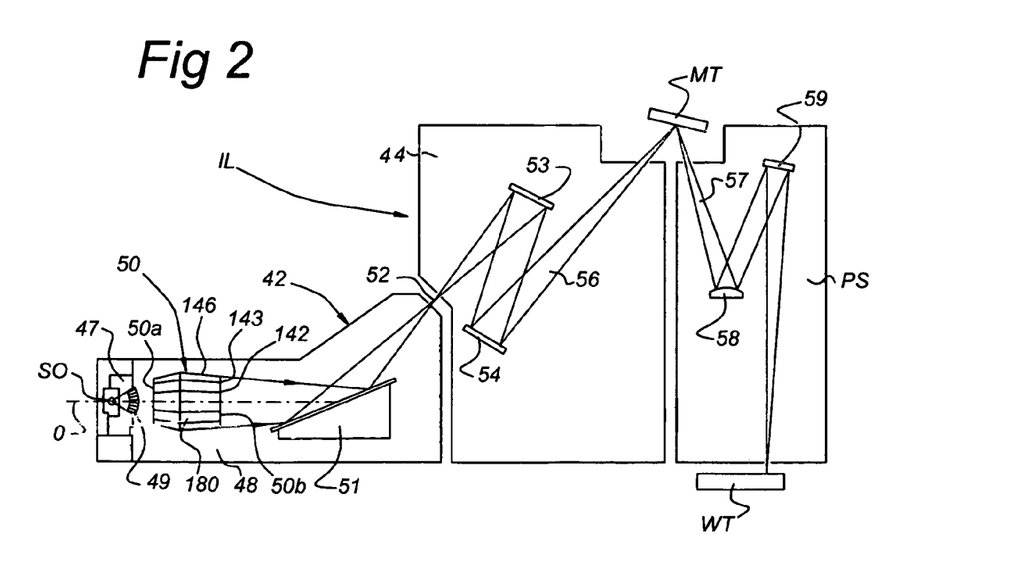
FIG. 2 schematically depicts a side view of an EUV illumination system and projection optics of a lithographic apparatus according to FIG. 1.

Referring to FIG. 2, this figure shows the projection apparatus 1 in more detail, comprising a radiation system 42, an illumination optics unit 44, and the projection system PS. The radiation system 42 comprises the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The gas barrier 49 may comprise a channel structure.

The collector chamber 48 comprises a radiation collector 50 which may be formed by a grazing incidence collector. Radiation collector 50 has an upstream radiation collector side 50a and a downstream radiation collector side 50b. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto a reticle or mask positioned on reticle or mask table MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in the Figures, for example there may be 1-4 more reflective elements present than 58, 59. Radiation collectors 50 are known. Reference number 180 indicates a space between two reflectors, e.g. between reflectors 142 and 143.

All optical elements shown in FIG. 2 (and optical elements not shown in the schematic drawing of this embodiment) are vulnerable to deposition of contaminants produced by source SO, for example, Sn or to carbon deposition. This is the case for the radiation collector 50 and, if present, the grating spectral filter 51. Hence, an electrical discharge generator (depicted in FIGS. 3-5, and described in more detail below) may be used to clean one or more of these optical elements as well as the cleaning method of the present invention may be applied to those optical elements, but also to normal incidence reflectors 53, 54 and reflective elements 58, 59 or other optical elements, for example additional mirrors, gratings, etc. However, the electrical discharge generator may also be used to clean one or more walls (internal walls) of radiation system 42 (not comprising source chamber 47), collector chamber 48, illumination optics unit 44 (IL) and projection system PS, or other elements present in these chambers.

Radiation collector 50 may be a grazing incidence collector. The collector 50 is aligned along an optical axis 0. The source SO or an image thereof is located on optical axis O. The radiation collector 50 may comprise reflectors 142, 143, 146. Sometimes they are also called shell. These reflectors 142, 143, 146 may be nested and rotationally symmetric about optical axis O. In FIG. 2 (as well as in other figures), an inner reflector is indicated by reference number 142, an intermediate reflector is indicated by reference number 143, and an outer reflector is indicated by reference number 146. The radiation collector 50 encloses a certain volume, i.e. the volume within the outer reflector(s) 146. Usually, this volume within outer reflector(s) 146 is circumferentially closed, although small openings may be present. All the reflectors 142, 143 and 146 comprise surfaces of which at least part comprises a reflective layer or a number of reflective layers. Hence, reflectors 142, 143 and 146 (more reflectors may be present and are comprised herein), comprise at least part designed for reflecting and collecting EUV radiation from source SO, and at least part of the reflector may not be designed for reflecting and collecting EUV radiation. For example, at least part of the back side of the reflectors may not be designed for reflecting and collecting EUV radiation. The latter part may also be called back side. On the surface of these reflective layers, there may in addition be a cap layer (for instance Ru) for protection or as optical filter provided on at least part of the surface of the reflective layers.

The radiation collector 50 is usually placed in the vicinity of the source SO or an image of the source SO. Each reflector 142, 143, 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured for generating a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

During use, on one or more of the outer 146 and inner 142/143 reflector(s) deposition may be found, especially Sn when a Sn source SO is used. Deposition of Sn, for example due to a Sn source, may, after a few mono-layers, be detrimental to reflection of the radiation collector 50 or other optical elements, which may necessitate the cleaning of such optical elements. Detrimental herein refers to reduction and loss of reflectivity of those reflecting surfaces of the reflector or mirror that is designed to reflect (and/or collect) radiation. Deposition may also be detrimental to the surface (that is designed to sense) of for instance an optical sensor. Further, as mentioned above alternatively or in addition, also carbon deposition (comprising hydrocarbons) may be found.

Deposition, especially deposition comprising Sn, may be removed in an embodiment by halogens (as gasses), for example, $F_2$, $Cl_2$, $Br_2$ and $I_2$ and, in another embodiment by hydrogen radicals, and in yet a further embodiment by combinations of hydrogen radicals and one or more halogens, either applied simultaneously or subsequently. In case there is a deposition with e.g. Sn, due to the presence of small amounts of oxygen, there will usually also be to some extent Sn oxide. To remove Sn oxides, a reduction step may be necessary before elemental Sn can be removed in an embodiment with a halogen gas by the formation of halogenides, or in an embodiment by a removal of the reduced oxide with hydrogen radicals by the formation of hydrides.

Nitrogen radicals may be used to remove carbon deposition. Hence, hydrogen radicals or nitrogen radicals or both hydrogen and nitrogen radicals, may in an embodiment be provided to at least part of a surface of collector mirror 50, or at least part of a surface to be cleaned of other (optical) elements. Such surfaces are e.g. the EUV reflecting surfaces of reflectors 142, 143 and 146 which may be contaminated with deposition like Sn and C or the internal surfaces of chambers 42, 48, 44 (IL) and PS. The term "pressure" thus especially refers to the pressure in a chamber or other volume of for instance the lithographic apparatus where the element to be cleaned is situated. For instance it refers to the illumination optics IL or to chambers 42, 48, 44 (IL) and PS, or to the pressure experienced within collector mirror 50.

Figure 3:
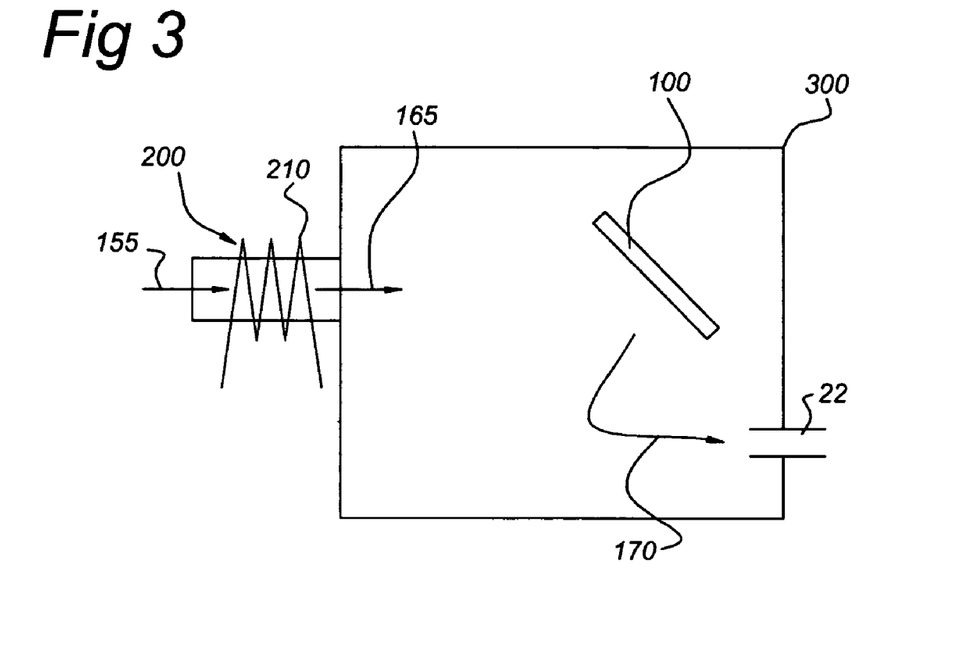
FIG. 3 schematically depicts an embodiment wherein an electrical discharge is inductively generated.

FIG. 3 schematically depicts an embodiment wherein an electrical discharge is inductively generated (elements implicit to the operation of an inductive electrical discharge, such as a voltage source, have not been included in this schematic drawing). A chamber 300 is shown, which may for instance be one of chambers 42, 48, 44 (IL) and PS, respectively, which chamber comprises an optical element 100. In this schematic drawing, a mirror or grating is depicted as optical element 100, which especially represents any of the optical elements mentioned above. A flow of gas 155 containing for instance hydrogen or nitrogen or both hydrogen and nitrogen is provided to this chamber. At least part of the gas 155 is subjected to an electrical discharge which is generated by an electrical discharge generator 200. In this embodiment, the electrical discharge generator 200 generates an inductive discharge by using a coil or coils 210. In an embodiment, the electrical discharge generator 200 is arranged to generate a RF inductive discharge. Hence, the gas after the electrical discharge generator 200 is a gas 165 containing radicals. This gas 165 containing radicals can be used to clean walls of chamber 300 and/or to clean optical element 100, or other elements as mentioned above, but not depicted in this schematic drawing. In an embodiment, an exhaust 22 may be present, for removal of formed products 170, which may for instance comprise hydrides (in case a hydrogen containing gas is used), halides (in case halides are used), nitrides (in case a nitrogen containing gas is used) or combinations of two or more thereof, in case combinations of two or more of such gasses are used. After a first hydrogen radical and/or nitrogen radical cleaning or treatment, a halogen cleaning may follow.

Figure 4:
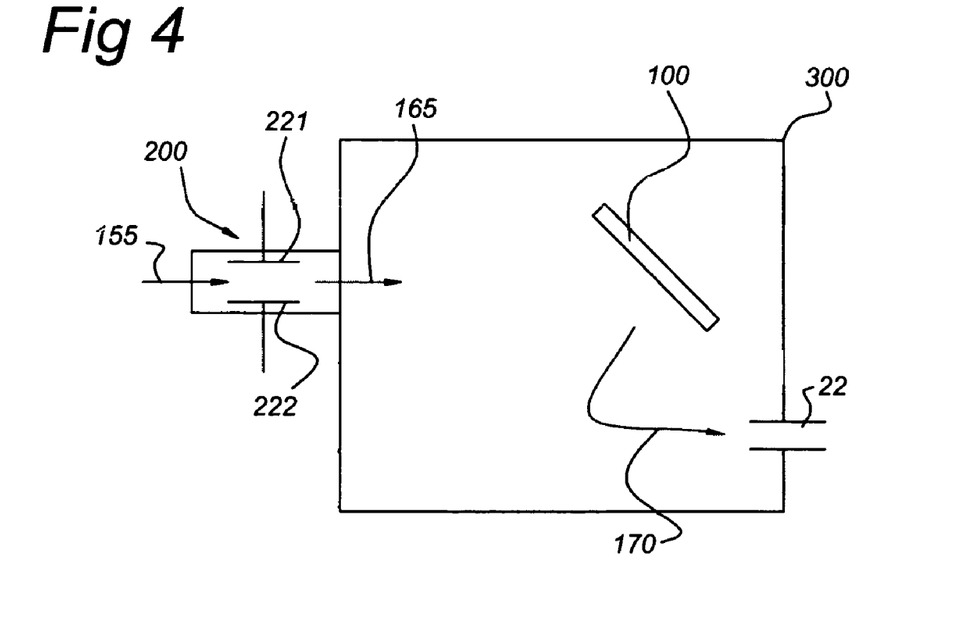
FIG. 4 schematically depicts an embodiment wherein an electrical discharge is capacitively generated.

FIG. 4 schematically depicts an embodiment wherein an electrical discharge is capacitively generated (elements implicit to the operation of a capacitive electrical discharge have not been included in this schematic drawing). A chamber 300 is shown, which may for instance be one of chambers 42, 44 (IL) and PS, respectively, which chamber comprises an optical element 100. In this schematic drawing, a mirror or grating is depicted as optical element 100, which especially represents any of the optical elements mentioned above. A flow of gas 155 containing for instance hydrogen or nitrogen or both hydrogen and nitrogen is provided to this chamber. At least part of the gas 155 is subjected to an electrical discharge which is generated by an electrical discharge generator 200. In this embodiment, the electrical discharge generator 200 generates a capacitive discharge by using charged surfaces 221 and 222, such as charged plates, although such plates may also comprise part of walls, which parts are conducting (i.e. such plates are integrated with such walls). A capacitor is a device that stores energy in the electric field created between a pair of conductors (charged surfaces or plates or electrodes). These two plates (surfaces or electrodes) are conductive and are separated by an insulator or dielectric. Herein the term "plate" is used. The term "plate" also refers to (charged) electrodes or (charged) surfaces. These plates or surfaces 221 and 222 are electrically insulated from each other, and are used as electrode and counter electrode. In an embodiment, the electrical discharge generator 200 is arranged to generate a RF capacitive discharge. Hence, the gas after the electrical discharge generator 200 is a gas 165 containing radicals. This gas 165 containing radicals can be used to clean walls of chamber 300 and/or to clean optical element 100, or other elements as mentioned above, but not depicted in this schematic drawing. In an embodiment, an exhaust 22 may be present, for removal of formed products 170, which may for instance comprise hydrides (in case a hydrogen containing gas is used), halides (in case halides are used), nitrides (in case a nitrogen containing gas is used) or combinations of two or more thereof, in case combinations of two or more of such gasses are used. After a first hydrogen radical and/or nitrogen radical cleaning or treatment, a halogen cleaning may follow.

Herein, the charged surfaces, plates or objects 221 and 222 which are used as electrode and counter electrode are further indicated as "plates". These plates 221 and 222 are arranged to generate a capacitively induced discharge between them, especially a RF discharge. In an embodiment, plates or objects 221 and 222 may be covered with an isolator top layer to prevent electro-erosion of the electrode(s), thereby diminishing or preventing the generation of additional impurities in the (cleaned) volume.

It should be appreciated that the voltage, frequency etc. applied to coil 210 or plates or objects 221 and 222 (and 240, vide infra) may be chosen to generate an electrical RF discharge.

The term "electrical discharge generator arranged to generate an electrical discharge" implies that the discharge generator comprises a source for providing a current through coil 201, when discharge generator 200 comprises a coil 210 and is arranged to generate an inductive discharge, or for applying a voltage over an electrode and counter electrode (for instance plates or objects 221 and 222 (and 240, vide infra), when discharge generator 200 comprises an electrode and counter electrode (also indicated as plates or objects 221 and 222 (and 240, vide infra)) and is arranged to generate a capacitive discharge. Discharge generator 200 is arranged to generate radicals and is arranged such that the radicals can be used to treat a surface of an element to be treated.

Hence, according to an aspect of the invention, there is provided a lithographic apparatus 1, comprising a source SO and one or more optical elements, the lithographic apparatus 1 further comprising an electrical discharge generator 200 arranged to generate an electrical discharge, especially a radio frequency discharge. In an embodiment, the electrical discharge generator 200 is arranged to generate an inductive or a capacitive RF discharge. The electrical discharge generator 200 is arranged in the lithographic apparatus 1 that at least part of the radical containing gas 165 collides with (the surface of) the element to be cleaned. This may for instance imply a distance of the electrical discharge 230 of the (surface of) the element to be cleaned of 1 m or less and the use of gas flow. Hence, in an embodiment, discharge generator 200 is arranged to generate an electrical discharge at a distance of 1 meter or less from the element to be cleaned. This means that the hydrogen radicals are generated at a distance of 1 m or less from (the surface of) the element to be cleaned. Hence, discharge generator 200 is arranged to enable treatment or cleaning of an element, especially an optical element, to be treated or cleaned by the radicals, generated by discharge generator 200 from gas 155 (especially $H_2$, $N_2$ or both $N_2$ and $H_2$, although for instance also in addition to $N_2$ or instead of $N_2$ $NH_3$ may be applied)

Figure 5A:
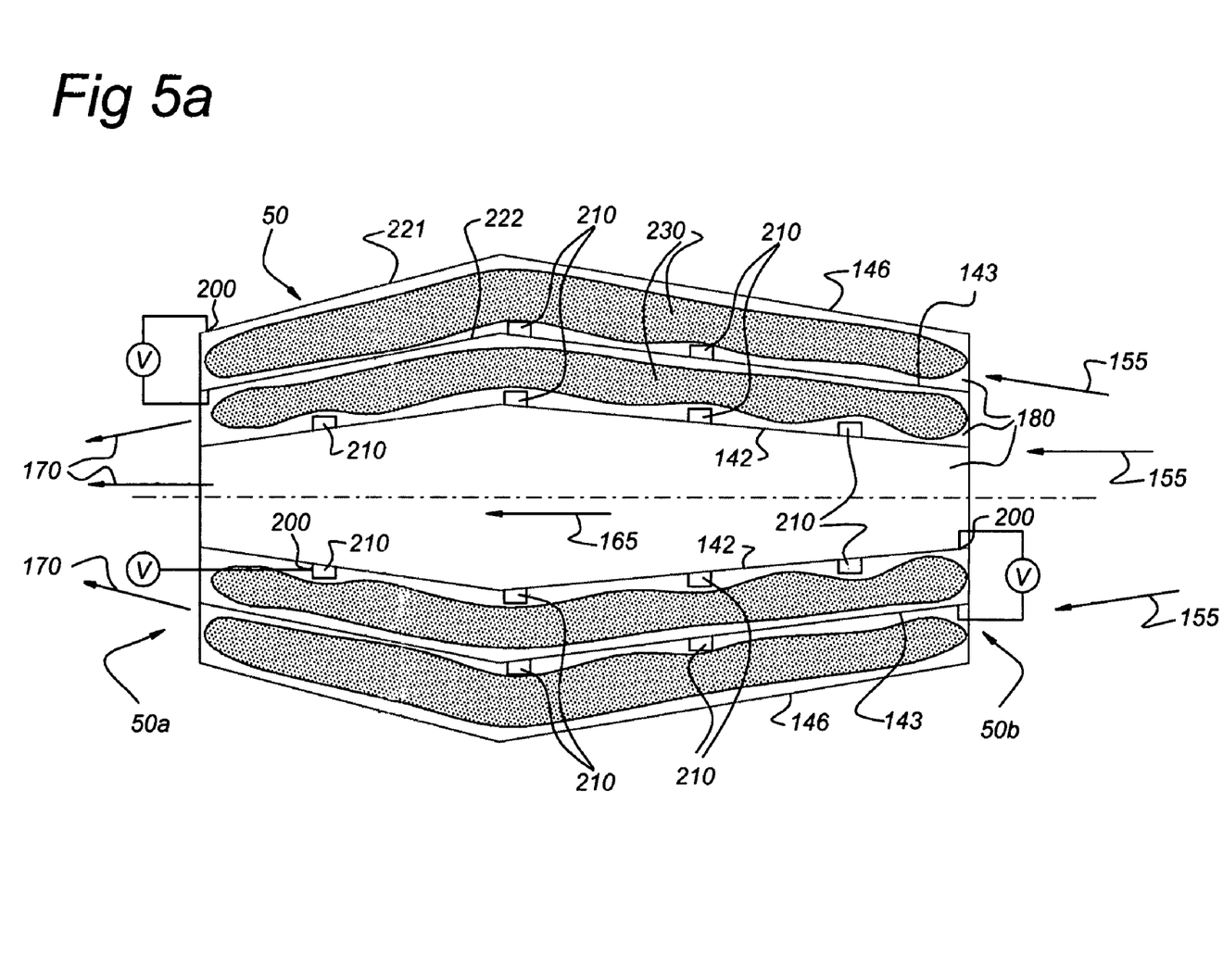
FIGS. 5a-b schematically depict embodiments and variants of discharge generators integrated with a collector mirror.

FIG. 5a schematically depicts an embodiment and variants of discharge generators 200 integrated with a collector mirror 50. Here, the lithographic apparatus 1 (not depicted, but see for instance FIG. 2) comprises collector 50 mirror, wherein the collector mirror 50 comprises a number of reflectors 142, 143, 146, and wherein the electrical discharge generator 200 is integrated with the collector mirror 50 and arranged to generate one or more discharges 230 between at least two reflectors. The electrical discharge(s) 230 are schematically depicted as shaded areas 230. The collector mirror 50 may comprise more reflectors (or less) than depicted and more discharges 230 than depicted may be generated. For instance, also an electrical discharge 230 may be generated within central reflector 142. The real form and shape of the electrical discharge(s) 230 may of course be different from the schematic drawings and may depend upon geometry of the reflectors (142, 143, and 146), the voltage, and the geometry of the electrical discharge generator(s) 200.

FIG. 5a shows two possible variants of the incorporation of the electrical discharge generator 200. In an embodiment, the lithographic apparatus 1 (not shown, but see for instance FIG. 2) comprises collector mirror 50, wherein the collector mirror 50 comprises one or more conducting coils 210. Such coil may at least partially surround a reflector. Hence, discharge generator 200 comprises one or more conduction coils 210, which can be used to generate an inductively generated RF discharge. In the other embodiment, lithographic apparatus 1 comprises collector mirror 50, wherein the collector mirror 50 comprises a number of reflectors (142, 143, and 146), and wherein the reflectors (142, 143, 146, etc.) (rotationally symmetric about optical axis O, see FIG. 2) comprise one or more conducting plates (221, 222 (etc.)), and wherein the conducting plate on a reflector and a conducting plate on an adjacent reflector are isolated from each other. Schematically, only two conducting plates 221 and 222 are depicted, which are arranged on adjacent reflectors 146 and 143. However, each reflector may comprise one or more conducting plates. The conducting plates are arranged to be used to generate a capacitive discharge, especially between two reflectors. A number of opposite of each other arranged conducting plates may be used to generate a number of discharges 230 between two adjacent reflectors. In an embodiment, the hydrogen and or nitrogen containing gas 155 enters from side 50b (downstream), i.e. the opening of collector mirror 50 that is most remote from source SO (see also FIG. 2) and flows within the collector 50 in the direction of source SO. Gas with hydrides and/or nitrides 170 exits then at opening 50a, most close to source SO. In an embodiment, coils 210 are integrated with one or more reflectors (142, 143, 146, etc.), in order to avoid reflection losses. In yet another embodiment, coils 210 are arranged on one or more reflectors (142, 143, 146, etc.) at positions with no direct radiation of source SO (shadow), for instance coils 210. This may for instance be in FIG. 5a just right of the edge in the reflectors.

Figure 5B:
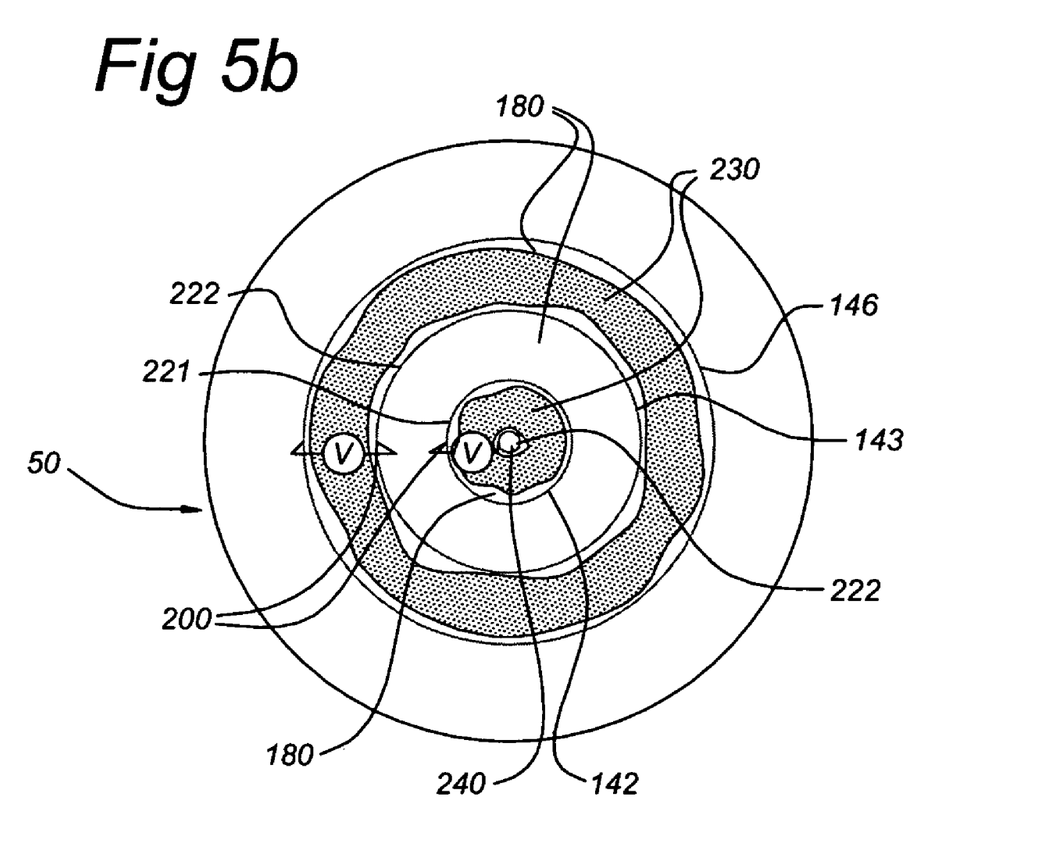

In a further embodiment, referring to FIG. 5b, an electrical discharge 230 may be generated within central reflector 142 by using a central structure (or other object, especially a central cylinder) 230 that at least partly penetrates the central space 180 and which, in an embodiment, has a central axis coinciding with optical axis O, which central structure 240, or one or more parts of central structure 240 may be used as conducting plate or object 222 (electrode) to generate a RF capacitive discharge within collector 142 (counter electrode 221), i.e. within space 180. This central structure 240 is not depicted in FIG. 5a, but is depicted in a front view of collector mirror 50 in FIG. 5b.

Hence, reflectors or part of reflectors 142, 143, 146 and central structure or part of central structure 240 may be used as electrodes and counter electrodes (221/222), respectively, arranged to generate a capacitively induced RF discharge. Central structure 240 may be present as support for collector mirror 50 and/or support for contaminant barrier 49. In an embodiment, central structure 240, especially a central cylinder, may be contain a rotating element for a rotating contaminant trap 49. Hence, in an embodiment lithographic apparatus 1 is provided, wherein the lithographic apparatus 1 comprises collector mirror 50, wherein the collector mirror 50 comprises a number of reflectors (142, 143, 146, etc.), wherein the reflectors, nested rotationally symmetric about optical axis O, further comprising central structure 240, wherein at least part of the central structure 240 is arranged to generate a capacitive discharge 230 between the central structure 230 and adjacent reflector 142.

Hence, a number of elements of collector mirror 50 can be used, such as reflectors (142, 143, 146, etc.) and central structure 240. To generate a capacitively induced RF discharge, two of these elements or two conducting parts of these elements are selected and a voltage is applied between these elements or parts of these elements as electrode and counter electrode. These elements or part of these elements between which an electrical discharge is generated are electrically insulated from each other.

Other objects within collector mirror 50 that may be used for arranged coils or plates or bars, etc. which can be used for generating an electrical discharge, or which objects may be used itself for generating an electrical discharge (when a voltage is applied to such object) are so called "spider wheels", which are supports for supporting mirrors 142, 143 and 146.

Therefore, discharge generator 200 is arranged to provide an electrical discharge (discharge 230, see schematic drawings 5a and 5b), especially a RF discharge, more especially a RF conductive or capacitive discharge, which discharge is used to create one or more radical containing gasses 165 selected from the group of a gas containing nitrogen radicals, a gas containing hydrogen radicals and a gas containing hydrogen and nitrogen radicals, and which radicals 165 can be used for cleaning one or more elements of lithographic apparatus 1, especially for cleaning one or more optical elements 100. Hence, discharge generator 200 is arranged to generate nitrogen radicals or hydrogen radicals or both nitrogen and hydrogen radicals from at least part of a gas 155 containing one or more selected from the group of nitrogen and hydrogen, thereby forming a radical containing gas 165, and arranged to enable providing the radical containing gas 165 to the one or more elements of the apparatus for cleaning (surfaces of) such elements, especially of optical elements 100 (such as collector mirror 50).

In an alternative embodiment, an discharge generator is provided arranged to generate a discharge selected from the group of a direct current discharge, an alternate current discharge, a microwave discharge and a helicon discharge. Also in this way radicals can be generated that can be used for removal of carbon deposition, removal of Sn deposition, reduction of Sn-oxide deposition or removal of oxygen.

Hence, according to an embodiment H radicals are generated from $H_2$ by not using a hot W wire, but by applying a RF inductive or capacitive discharge. This eliminates the possibility of W evaporation (and/or other wire material) and thus the potential damage of mirrors or other optical elements. In an embodiment, a RF discharge is generated inside the collector mirror 50. In this case the reflectors (shells) (142, 143, 146, etc.) are in an embodiment alternatingly isolated from each other and RF discharge(s) can be generated between the respective reflectors (shells). $H_2$ or $N_2$ or both $H_2$ and $N_2$ will be flown into shells and thus H or N or both H and N will be produced locally at each place in the shells (142, 143, 146, etc.). H then can be used both for reduction of SnOx (Sn-oxides) for further halogen cleaning as well as for direct Sn cleaning by H and H can also be used for the removal of carbon deposition or for the removal of oxygen (for instance left in the system). For the latter two processes, nitrogen can also be used since nitrogen radicals can react with carbon deposition forming volatile nitrides and with oxygen forming nitrogen oxide compounds. Such local production provides lower and uniform H concentration at the collector mirrors and thus decreased chance H mirror damage.

Further, $H^+$, $H_2^+$ and $H_3+$ may be produced in the RF discharge when $H_2$ (or analogues are present), which stimulates the reduction and Sn cleaning reaction.

Atomic nitrogen, in contrast to atomic hydrogen, can not substantially penetrate cap Ru layers of for instance EUV mirrors (such as collector mirror 50 in an EUV lithographic apparatus), and thereby it can not damage EUV mirror. Further, atomic nitrogen is supposed to have much larger chemical efficiency in cleaning as EUV chamber as ML mirror due to its larger chemical potential and possibility to form stable gaseous substances not only with carbon, but with oxygen as well than hydrogen. As a result cleaning rate may be larger. Larger possible concentration of N (due to the absence of diffusion into Ru cap layer) may increase cleaning rate as well.

In an embodiment, the lithographic apparatus comprises an EUV lithographic apparatus. The invention is however not limited to EUV radiation alone, but may also be used for lithographic apparatus that use other radiation, as described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

Use of the verb "to comprise" and its conjugations does not exclude the presence of elements or steps other than those stated in a claim. The article "a" or "an" preceding an element does not exclude the presence of a plurality of such elements. The invention may be implemented by hardware comprising several distinct elements, and by a suitably programmed computer. In the device claim enumerating several devices/apparatus, several of these devices/apparatus may be embodied by one and the same item of hardware. The mere fact that certain measures are recited in mutually different dependent claims does not indicate that a combination of these measures cannot be used to advantage.

What is claimed is:

1. A method for cleaning an element of a lithographic apparatus, the method comprising:
    providing a gas containing nitrogen;
    generating atomic nitrogen from at least part of the gas, thereby forming an atomic nitrogen containing gas;
    providing a hydrogen radical containing gas to the element of the apparatus;
    providing at least part of the atomic nitrogen containing gas to the element of the apparatus subsequent to the providing the hydrogen radial containing gas to the element of the apparatus; and
    removing a carbon deposition from the element by reacting the atomic nitrogen containing gas provided to the element with the carbon deposition.

2. The method according to claim 1, wherein the lithographic apparatus comprises an EUV lithographic apparatus.

3. The method according to claim 1, wherein the gas containing nitrogen comprises $N_2$.

4. The method according to claim 1, wherein the atomic nitrogen is generated from the gas containing nitrogen using an electrical discharge.

5. The method according to claim 1, wherein the atomic nitrogen is generated from the gas containing nitrogen using a radio frequency discharge.

6. The method according to claim 5, wherein the electrical discharge comprises an inductive or a capacitive discharge.

7. The method according to claim 1, wherein the element of the lithographic apparatus is selected from the group of a mirror, a grating, a reticle, a sensor, a support, a lithographic apparatus chamber and a lithographic apparatus wall.

8. The method according to claim 1, wherein the gas containing nitrogen further comprises a halogen.

9. The method according to claim 1, further comprising providing a halogen containing gas to the element subsequent to the providing the atomic nitrogen containing gas to the element.

10. A method for cleaning an element of a lithographic apparatus, the method comprising:
    providing a gas containing nitrogen;
    generating atomic nitrogen from at least part of the gas, thereby forming an atomic nitrogen containing gas;
    providing a hydrogen radical containing gas to the element of the apparatus;
    providing at least part of the atomic nitrogen containing gas to the element of the apparatus subsequent to the providing the hydrogen radical containing gas to the element; and
    removing oxygen from the element by reacting the atomic nitrogen containing gas provided to the element with the oxygen.

11. The method according to claim 10, wherein the lithographic apparatus comprises an EUV lithographic apparatus.

12. The method according to claim 10, wherein the gas containing nitrogen comprises $N_2$.

13. The method according to claim 10, wherein the atomic nitrogen is generated from the gas containing nitrogen using an electrical discharge.

14. The method according to claim 10, wherein the atomic nitrogen is generated from the gas containing nitrogen using a radio frequency discharge.

15. The method according to claim 14, wherein the electrical discharge comprises an inductive or a capacitive discharge.

16. The method according to claim 10, wherein the element of the lithographic apparatus is selected from the group of a mirror, a grating, a reticle, a sensor, a support, a lithographic apparatus chamber and a lithographic apparatus wall.

17. The method according to claim 10, wherein the gas containing nitrogen further comprises a halogen.

18. The method according to claim 10, further comprising providing a halogen containing gas to the element subsequent to the providing the atomic nitrogen containing gas to the element.

* * * * *

UNITED STATES PATENT AND TRADEMARK OFFICE
CERTIFICATE OF CORRECTION

| | | |
|---|---|---|
| PATENT NO. | : 8,317,929 B2 | Page 1 of 1 |
| APPLICATION NO. | : 11/367693 | |
| DATED | : November 27, 2012 | |
| INVENTOR(S) | : Tatyana Victorovna Rakhimova et al. | |

It is certified that error appears in the above-identified patent and that said Letters Patent is hereby corrected as shown below:

On title page, Item (75) Inventors - Line 4
  replace "Vitalevich"
  with --Vitalevitch--.

On title page, Item (75) Inventors - Line 7
  replace "Johannes"
  with --Josephina--.

Signed and Sealed this
Fifteenth Day of January, 2013

David J. Kappos
*Director of the United States Patent and Trademark Office*